(12) United States Patent
Peterson

(10) Patent No.: US 6,791,889 B2
(45) Date of Patent: Sep. 14, 2004

(54) DOUBLE DATA RATE MEMORY INTERFACE

(75) Inventor: Steve A. Peterson, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 10/358,452

(22) Filed: Feb. 4, 2003

(65) Prior Publication Data

US 2004/0151053 A1 Aug. 5, 2004

(51) Int. Cl.[7] .................................................. G11C 7/00
(52) U.S. Cl. ................. 365/193; 365/233; 365/189.02
(58) Field of Search ................................ 365/193, 233, 365/189.02, 194

(56) References Cited

U.S. PATENT DOCUMENTS 6,091,664 A * 7/2000 Ramanadin .................. 365/194
6,134,180 A * 10/2000 Kim et al. .................... 365/233
6,282,132 B1 * 8/2001 Brown et al. ................ 365/193

* cited by examiner

*Primary Examiner*—Huan Hoang
(74) *Attorney, Agent, or Firm*—Lanny L. Parker

(57) ABSTRACT

A system supports Double Date Rate (DDR) or Single Data Rate (SDR) data transfers on a data bus between a processor and a memory device. A controller-side interface block connects to a memory-side interface block for generating the control signals and transferring stored data from the memory device to the processor.

20 Claims, 3 Drawing Sheets

DOUBLE DATA RATE MEMORY INTERFACE

As manufacturers introduce computers with faster and more powerful CPUs, there remains a struggle within the memory industry to develop semiconductor technology that allows system memory to exchange data with today's high performance CPUs more quickly and efficiently. One semiconductor technology called Synchronous Dynamic Random Access Memory or more commonly, Synchronous DRAM or SDRAM was designed to match system memory speed with that of the processor. SDRAM was designed to improve the performance of the overall computer because the memory is fast and utilizes a clock that is synchronized with the processor. Therefore, the processor may perform other operations without waiting for the memory to locate the address and read or write the data.

Double Data Rate-Synchronous DRAM, a type of SDRAM that supports data transfers on both the rising and falling clock edges of each clock cycle, effectively doubles the memory chip's data throughput. However, synchronizing the data from the SDRAM to a system clock provided by the processor necessitates precise timing circuitry that is power consuming. Accordingly, there is a continuing need for better ways to provide flexibility for transferring data between a microprocessor and memory while preserving low power operation and the stability of the data transfers.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
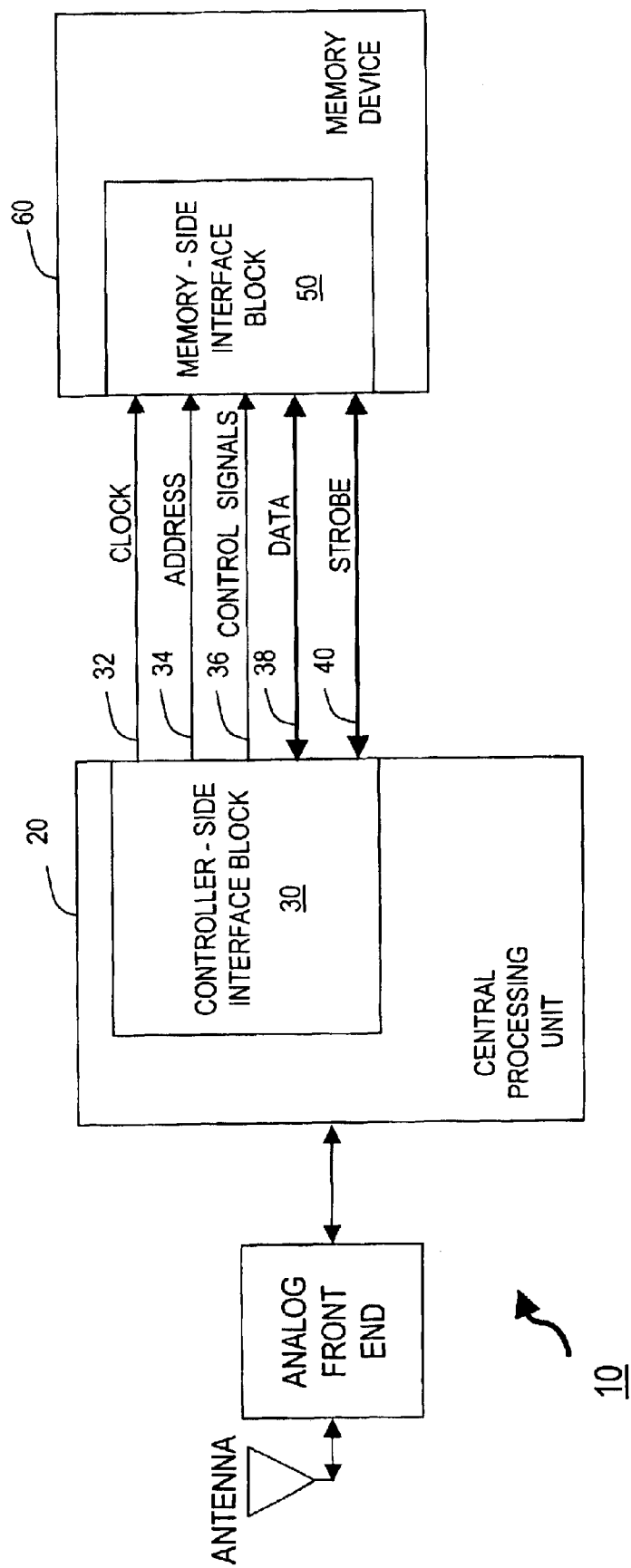
FIG. 1 is a block diagram that illustrates signals used across a memory interface to support a Double Data Rate (DDR) memory in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

FIG. 1 illustrates an interface for a processor 20 and a memory device 60 in which the features of the present invention may be practiced. Although processor 20 and memory device 60 are shown incorporated into a wireless device 10, the processor and memory may be included together in other applications that utilize a high storage data rate. Accordingly, embodiments of the present invention may be used in a variety of applications, with the claimed subject matter incorporated into microcontrollers, general-purpose microprocessors, baseband and application processors, Digital Signal Processors (DSPs), Reduced Instruction-Set Computing (RISC), Complex Instruction-Set Computing (CISC), among other electronic components.

In particular, the present invention may provide a signaling interface between a processor or controller and a memory device as used in electronic systems for laptop or notebook computers, smart phones, communicators, Personal Digital Assistants (PDAs), automotive infotainment and other products. In some embodiments, memory device 60 may be volatile memories such as, for example, a Static Random Access Memory (SRAM), a Dynamic Random Access Memory (DRAM) or a Synchronous Dynamic Random Access Memory (SDRAM), although the scope of the claimed subject matter is not limited in this respect.

In alternate embodiments, the memory devices may be nonvolatile memories such as, for example, an Electrically Programmable Read-Only Memory (EPROM), an Electrically Erasable and Programmable Read Only Memory (EEPROM), a flash memory (NAND or NOR type, including multiple bits per cell), a Ferroelectric Random Access Memory (FRAM), a Polymer Ferroelectric Random Access Memory (PFRAM), a Magnetic Random Access Memory (MRAM), an Ovonics Unified Memory (OUM), a disk memory such as, for example, an electromechanical hard disk, an optical disk, a magnetic disk, or any other device capable of storing instructions and/or data. However, it should be understood that the scope of the present invention is not limited to these examples.

In the example illustrated in FIG. 1, a Radio Frequency (RF) block may be coupled to processor 20 to allow wireless communications to other communication devices. Included in processor 20 is a controller-side interface block 30 that is coupled to a memory-side interface block 50 in memory device 60. Interface blocks 30 and 50 represent active circuitry to generate a CLOCK signal, ADDRESS signals, CONTROL signals, DATA signals and a STROBE signal to efficiently control data transfers between processor 20 and memory device 60, while ensuring that all proper timing relationships are retained.

According, the timing relationships that exist between the CLOCK signal, the DATA signals and the STROBE signals may be set in accordance with a desired design criteria, and adjustments may be made to account for process variations, temperature changes and voltage shifts. In other words, the timing relationships may be dynamically altered dependent on aging induced changes to the transistors or environmental changes that may affect the operation of the part.

Figure 2:
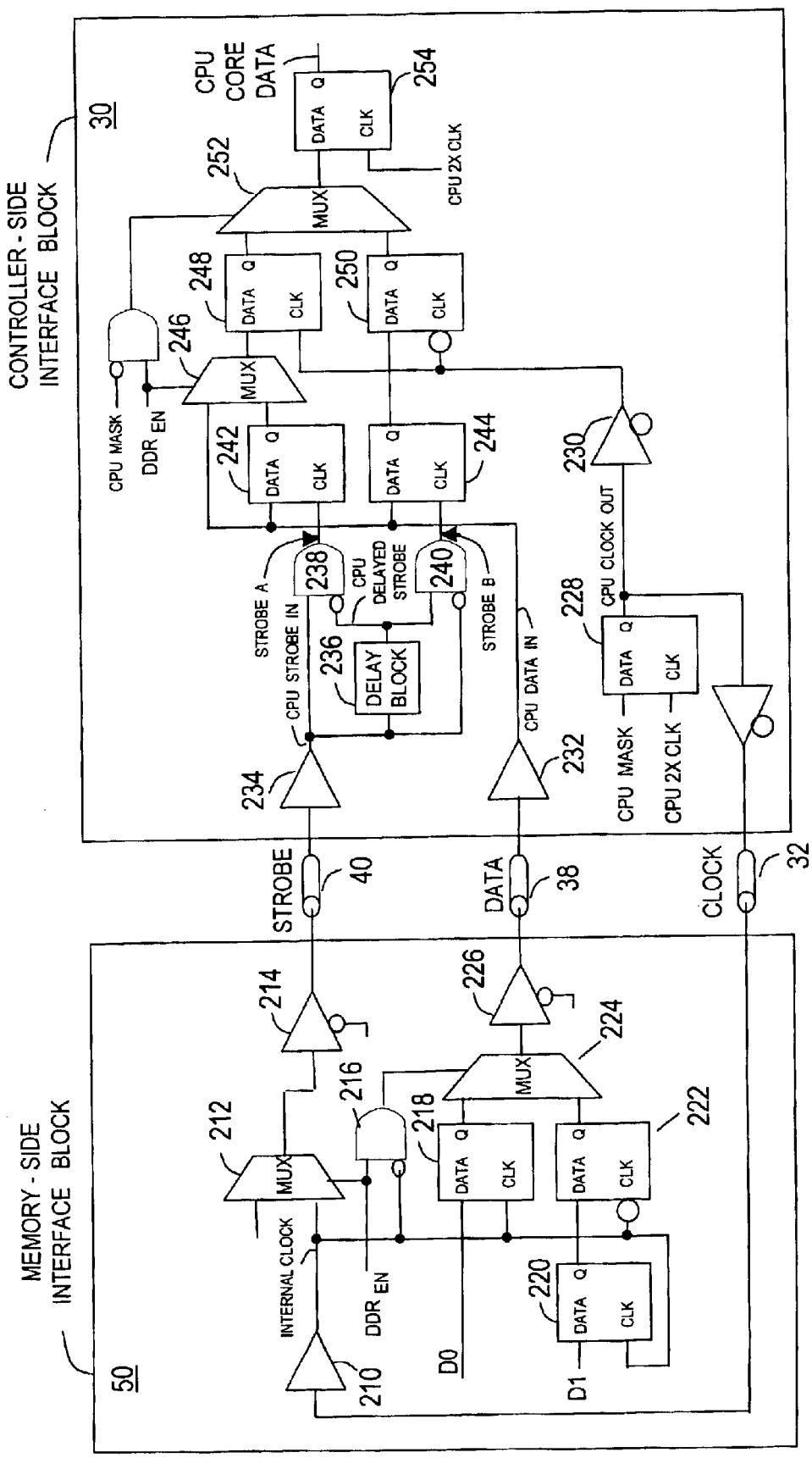
FIG. 2 is a schematic that illustrates one embodiment of the memory-side interface and controller-side interface for a DDR memory.

FIG. 2 is a DDR read logic schematic that illustrates controller-side interface block 30 connected to memory-side interface block 50 for reading stored data from memory device 60. In this embodiment the controller generates a clock signal CPU 2X CLK that is supplied as the clock input of a flip-flop 228 on the controller-side interface block 30. The output of flip-flop 228 provides a double rate clock signal as determined by the signal MASK at the data input of the flip-flop. The signal CPU CLOCK OUT generated at the output of flip-flop 228 is used both in memory-side interface block 50 and controller-side interface block 30. The signal CPU CLOCK OUT is transferred across interface connection 32 (labeled CLOCK) to a buffer 210. It should be noted that the figure shows read logic for a DDR mode, but it should be understood that the present invention may be applicable to data transfers at even higher data rates.

The output of buffer 210 provides the signal INTERNAL CLOCK to the CLK inputs of flip-flops 218 and 220, the inverting CLK input of flip-flop 222, the inverting input of AND-gate 216 and the input of MUX 212. The other input of AND-gate 216 receives the signal $DDR_{EN}$, with the output of AND-gate 216 connected to a control input of a MUX 224. An output signal of MUX 212 is passed through a buffer 214 for transfer across the interface connection 40 that bears the label STROBE. The DATA input of flip-flop 218 receives the signal D0, the DATA input of flip-flop 220 receives the signal D1, and the DATA input of flip-flop 222 is connected to the Q output of flip-flop 220. MUX 224 has inputs connected to the Q output of flip-flop 218 and to the Q output of flip-flop 222, with the MUX 224 output signal passed through a buffer 226 and transferred across the interface connection 38 that bears the label DATA.

In the controller-side interface block 30, a buffer 234 receives the signal STROBE and supplies a signal to an input of DELAY BLOCK 236, an input of AND-gate 238 and an inverting input of AND-gate 240. The output of DELAY BLOCK 236 is connected to an inverting input of AND-gate 238 and to another input of AND-gate 240. The output of AND-gate 238 supplies the signal STROBE A and the output of AND-gate 240 supplies the signal STROBE B. A buffer 232 receives the signal DATA, with the output of buffer 232 connected to the DATA input of latches 242 and 244. The respective CLK inputs of latches 242 and 244 receive the signal STROBE A and STROBE B. A MUX 246 has inputs connected to the output of buffer 232 and to an output of latch 242, with the output of the multiplexer connected to the DATA input of a flip-flop 248. The output of latch 244 is connected to the DATA input of flip-flop 250. The signal CPU CLOCK OUT supplied from flip-flop 228 is passed through buffer 230 to the CLK input of flip-flop 248 and to the inverting CLK input of flip-flop 250. The outputs of flip-flops 248 and 250 are connected to inputs of a MUX 252, with the output of the multiplexer connected to the DATA input of a flip-flop 254. Flip-flop 254 is clocked with the signal CPU 2X CLK and supplies the output signal CORE DATA.

Figure 3:
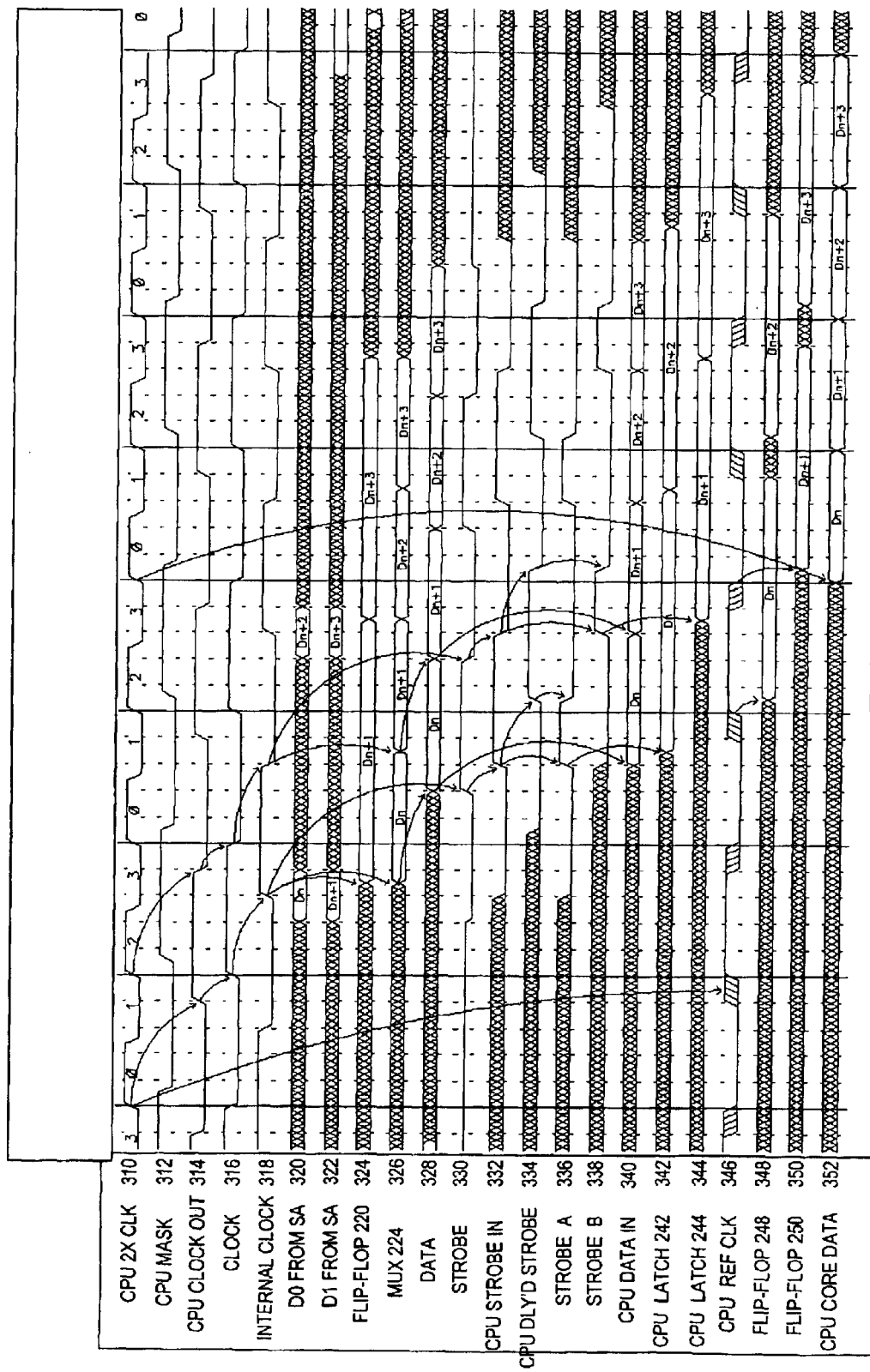
FIG. 3 is a timing diagram that illustrates the relationship of signals used to access the DDR memory.

FIG. 3 is a timing diagram that illustrates the relationship of signals used to access the DDR memory and supply data from memory-side interface block 50 to controller-side interface block 30 to be used by the CPU. Referring to FIGS. 2 and 3, waveform 310 illustrates the CPU 2X CLK signal supplied by the CPU as the CLK input of flip-flop 228. Waveform 312 illustrates the CPU MASK signal supplied to the DATA input of flip-flop 228. Flip-flop 228 supplies the signal CPU CLOCK OUT that is illustrated by waveform 314. The CLOCK signal transferred across the interface connection 32 is delayed from the signal CPU CLOCK OUT as illustrated by waveform 316, with additional delay through buffer 210 in generating the signal INTERNAL CLOCK illustrated by waveform 318.

Waveforms 320 and 322 illustrate the signals D0 and D1 as data supplied from the sense amps (not shown) that are coupled to the memory array. Waveform 324 illustrates the output signal of flip-flop 220 and waveform 326 illustrates the signal at the output of MUX 224. The DATA signal transferred across the interface connection 38 is delayed from the signal at the output of MUX 224 as illustrated by waveform 328. The STROBE signal transferred across the interface connection 40 is delayed from the signal INTERNAL CLOCK as illustrated by waveform 330. After passing the STROBE signal through buffer 234, the buffered signal CPU STROBE IN is illustrated by waveform 332. DELAY BLOCK 236 receives the signal CPU STROBE IN and supplies the signal CPU DELAYED STROBE as illustrated by the waveform 334. AND-gate 238 generates the signal STROBE A as illustrated by waveform 336 and AND-gate 240 generates the signal STROBE B as illustrated by waveform 338.

The DATA IN signal is delayed from the signal DATA as illustrated by waveform 340. The output signals generated by latches 242 and 244 are illustrated by respective waveforms 342 and 344. Waveform 346 illustrates the signal CPU REF CLK that is used to clock flip-flops 245 and 250 that generate respective output signals illustrated by waveforms 348 and 350. Waveform 352 illustrates the CPU 2X CLK signal generated at the output of flip-flop 228. The signal CPU CORE DATA illustrated by waveform 352 shows the data read by the CPU at the double data rate.

In operation, when processor 20 is selected to operate in a double data rate mode, flip-flops 218 and 220 clock the data D0 and D1 (waveforms 320 and 322 in FIG. 3) from the sense amps in the memory array of memory device 60. Another flip-flop, e.g. flip-flop 222 delays the data signal for the falling edge of the INTERNAL CLOCK signal. MUX 224 alternates selecting data from flip-flops 218 and 222 in DDR mode, selecting the data from flip-flop 218 during half the clock period and from flip-flop 222 during the other half of the clock period. The INTERNAL CLOCK (waveform 318) signal that clocks flip-flops 218, 220 and 222 to provide DATA (waveform 328) on interface connection 38 is delayed in MUX 212 to provide the STROBE (waveform 330) signal on interface connection 40. By design, MUX 212 properly aligns STROBE signal transitions with DATA transitions. Thus, MUX 212 provides a time delay in the STROBE signal measured from the INTERNAL CLOCK signal that matches a delay of DATA transferring through MUX 224 to buffer 226. The result is that the STROBE signal at interface connection 40 toggles at substantially the same time as the DATA at interface connection 38.

Processor 20 receives the STROBE signal from interface connection 40 and the DATA from interface connection 38. With transitions of the STROBE signal being coincident with DATA transitions, DELAY BLOCK 236 delays the STROBE signal by about one quarter of a clock period, and thereby, shifts the STROBE timing into the center of the DATA valid window. AND-gate 238 generates the signal STROBE A (waveform 336) as a latch enable signal for latch 242 and AND-gate 240 generates the signal STROBE B (waveform 338) as a latch enable signal for latch 244. Thus, the enable signals latch data relative to the rising and falling edges of the STROBE signal. The data latched by latches 242 and 244 is passed to a second set of flip-flops, e.g., flip-flops 248 and 250, that are clocked on the rising and falling edges of the internal reference clock (waveform 346). MUX 252 selects the data from flip-flops 248 and 250 to be appropriately clocked on the rising edge and falling edge of the clock signal CPU 2X CLK. The output of flip-flop 254 provides the CPU CORE DATA at a double data rate.

Whereas other memory interfaces include data strobes plus a Delay Lock Loop (DLL) in the memory device to realign the output timing to the memory clock, that DLL has been eliminated in the present invention. By eliminating the DLL from each memory device, the power requirements of the system may be reduced.

The embodiment for the read logic illustrated in FIG. 2 provides a critical read path for DDR that is similar to the read path for Single Data Rate (SDR). 30 With the exception of MUX 252 and flip-flop 254, other logic operates at the SDR speed. This implies that a DDR system having a 200 MHz data rate, for example, has similar critical timings as an SDR system operating at a 100 MHz data rate. It should be pointed out that processor 20 may operate in either the SDR mode or DDR mode, with the DDR EN signal selecting between the two modes. It should be further pointed out that the logic shown in FIG. 2 supports data transfers on the data bus for either DDR or SDR. Accordingly, processor may support multiple memory devices on the data bus, with one memory operating in DDR mode while another memory transfers data on the bus in the SDR mode.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method comprising:
   receiving a clock signal in a memory device from a processor;
   latching first and second data values from a memory array in flip-flops using the clock signal;
   generating data at an output terminal of the memory device where the data is alternately selected by one pass device from the first and second data values; and
   generating a strobe signal at an output terminal of the memory device that is delayed from the clock signal through another pass device to align transitions of the strobe signal with data transitions at the output terminals.

2. The method of claim 1 further comprising adding the another pass device to delay the strobe signal and match the delay in the one pass device that selects the first and second data values.

3. The method of claim 2 wherein adding the another pass device is adding a multiplexer.

4. The method of claim 1 wherein selecting data by the one pass device is selecting data using a multiplexer.

5. The method of claim 1 further including controlling the one pass device with the clock signal to alternately select the first and second data values.

6. The method of claim 5 further including gating the clock signal with a signal that enables a Double Data Rate (DDR) mode to control the one pass device.

7. A memory interface block, comprising:
   a first flip-flop having a data input coupled to receive a first memory data value and a clock input to receive a clock signal from a terminal pin;
   second and third flip-flops having data inputs to receive a second memory data value and a signal from an output of the second flip-flop, respectively, with the second and third flip-flops having a clock input to receive the clock signal; and
   a multiplexer coupled to receive output signals from the first and third flip-flops and provide data at a terminal pin that is alternatively selected from the first and third flip-flops.

8. The memory interface block of claim 7, further comprising a logic gate coupled to control the multiplexer, the logic gate to receive the clock signal.

9. The memory interface block of claim 7, further comprising a logic gate coupled to control the multiplexer, the logic gate to receive an enable signal that selects a Double Data Rate (DDR) mode.

10. The memory interface block of claim 7, further comprising:
    a pass device coupled to receive the clock signal and provide a strobe signal at a terminal pin, where the pass device provides an equivalent time delay to that of the multiplexer.

11. A method of transferring data between a processor and a memory device comprising:
    receiving a clock signal in the memory device from the processor;
    using the clock signal to latch first and second data values; and
    generating a strobe signal and the data at output terminals of the memory device where the data is alternately selected from the first and second data values and the strobe signal is delayed from the clock signal and aligned to transition with the data signal without using a Delay Lock Loop (DLL) in the memory device to align.

12. The method of claim 11 further comprising:
    receiving the strobe signal in the processor and generating a delayed strobe signal;
    using the strobe signal and delayed strobe signal in the processor to generate a first enable signal to latch the data in a first latch when the strobe signal has a first logic value; and
    using the strobe signal and delayed strobe signal in the processor to generate a second enable signal to latch the data in a second latch when the strobe signal has a second logic value.

13. The method of claim 12 further comprising:
    using the clock signal to capture the data stored in the first latch in a first flip-flop; and
    using the clock signal to capture the data stored in the second latch in a second flip-flop.

14. The method of claim 13 wherein generating a delayed strobe signal further comprises providing the delayed strobe signal using a Delay Lock Loop (DLL).

15. The method of claim 11 wherein generating a delayed strobe signal further comprises providing the delayed strobe signal with one quarter of a cycle delay from the strobe signal.

16. The method of claim 15 further comprising:
    alternately selecting data from the first and second flip-flops to provide the data at a Double Data Rate (DDR).

17. A circuit in a memory device comprising:
    a multiplexer coupled to receive first and second signals from a memory array and provide data at a first pin that is alternatively selected from the first and second signals; and
    a logic gate having an output coupled to provide a control signal to the multiplexer, the logic gate coupled to receive a clock signal and an enable signal that selects a Double Data Rate (DDR) mode.

18. The circuit of claim 17, further comprising:

another multiplexer coupled to receive the clock signal and provide a strobe signal at a second pin that is aligned to transition with the data.

19. The circuit of claim 17, wherein the strobe signal is aligned to the data without using a Delay Lock Loop (DLL) in the memory device.

20. The circuit of claim 17, wherein the multiplexer receives the first signal from the memory array being coupled through a first flip-flop and the second signal being coupled through second and third flip-flops.

* * * * *

UNITED STATES PATENT AND TRADEMARK OFFICE
CERTIFICATE OF CORRECTION

PATENT NO. : 6,791,889 B2
DATED : September 14, 2004
INVENTOR(S) : Peterson

It is certified that error appears in the above-identified patent and that said Letters Patent is hereby corrected as shown below:

Column 5,
Line 9, after "(SDR).", delete "30".
Line 17, after "processor", insert -- 20 --.

Signed and Sealed this

Seventeenth Day of May, 2005

JON W. DUDAS
*Director of the United States Patent and Trademark Office*